(12) United States Patent
Sung et al.

(10) Patent No.: US 9,548,249 B2
(45) Date of Patent: Jan. 17, 2017

(54) METHODS OF PERFORMING FIN CUT ETCH PROCESSES FOR FINFET SEMICONDUCTOR DEVICES AND THE RESULTING DEVICES

(71) Applicant: GLOBALFOUNDRIES Inc., Grand Cayman (KY)

(72) Inventors: Min Gyu Sung, Latham, NY (US); Catherine B. Labelle, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 163 days.

(21) Appl. No.: 14/633,544

(22) Filed: Feb. 27, 2015

(65) Prior Publication Data

US 2016/0254192 A1 Sep. 1, 2016

(51) Int. Cl.
*H01L 21/8234* (2006.01)
*H01L 21/762* (2006.01)
*H01L 21/308* (2006.01)

(52) U.S. Cl.
CPC ... *H01L 21/823431* (2013.01); *H01L 21/3083* (2013.01); *H01L 21/76224* (2013.01); *H01L 21/823481* (2013.01)

(58) Field of Classification Search
CPC ............. H01L 21/823431; H01L 21/3083; H01L 21/76224; H01L 21/823481
See application file for complete search history.

(56) References Cited

U.S. PATENT DOCUMENTS

2007/0018201 A1* 1/2007 Specht .............. H01L 21/84
257/204
2014/0367795 A1* 12/2014 Cai .................. H01L 27/0886
257/392

* cited by examiner

*Primary Examiner* — Errol Fernandes
(74) *Attorney, Agent, or Firm* — Amerson Law Firm, PLLC

(57) ABSTRACT

A method includes forming a plurality of fins above a substrate. A first mask layer is formed above a first subset of the fins. First portions of the fins in the first subset exposed by a first opening in the first mask layer are removed to define, for each of the fins, a first fin segment and a second fin segment, each having a cut end surface. A first liner layer is formed on at least the cut end surface of the first fin segment for each of the fins in the first subset. A second mask layer having a second opening is formed above a second subset of the plurality of fins. An etching process removes second portions of the second subset of fins exposed by the second opening. The first liner layer protects the cut end surface of at least the first fin segment during the removing.

20 Claims, 9 Drawing Sheets

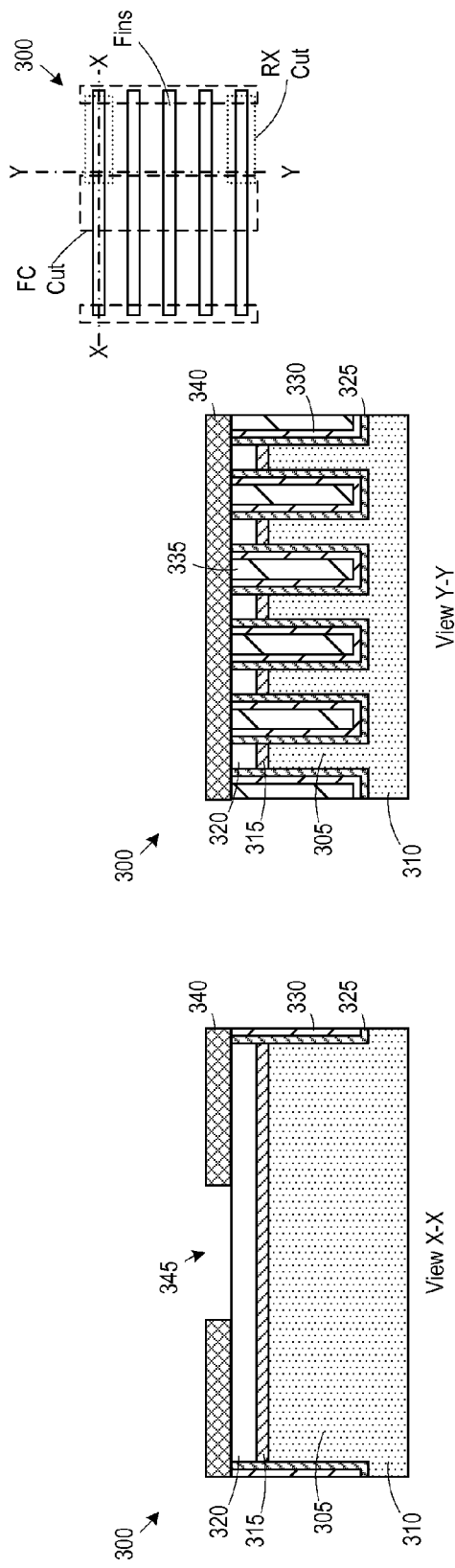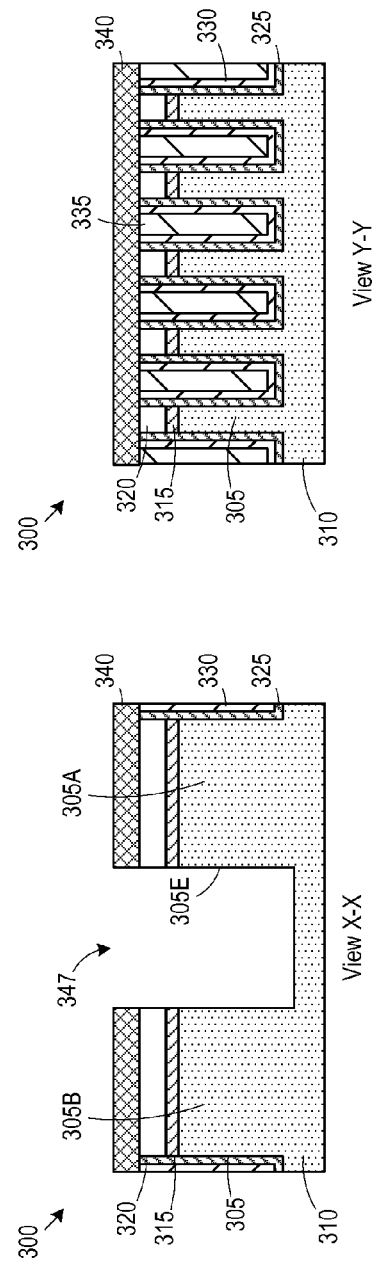
Figure 3C
Figure 3D

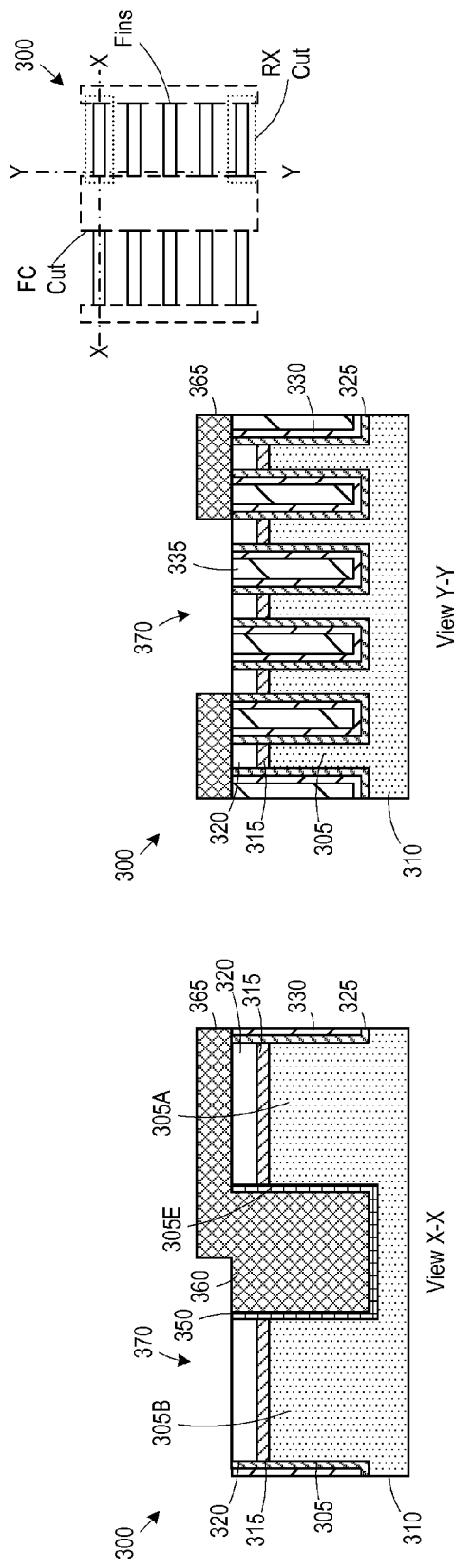
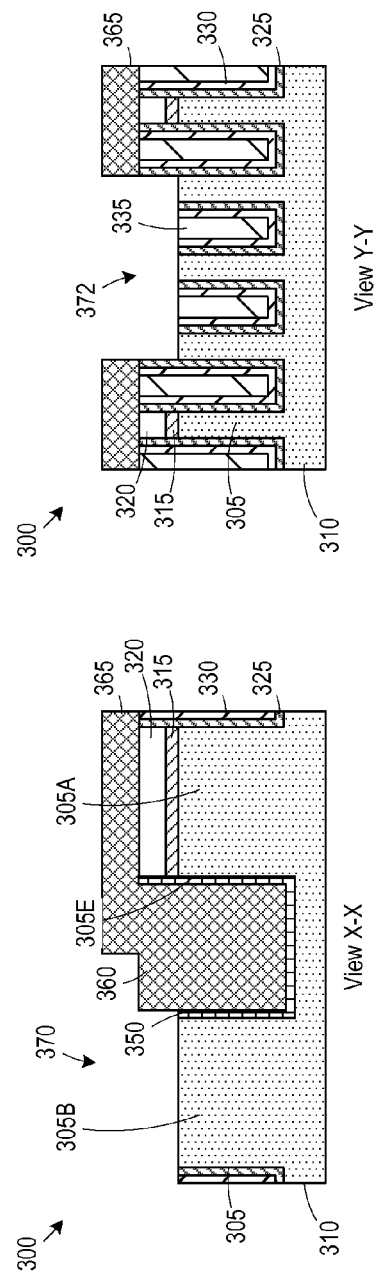
Figure 3G
Figure 3H

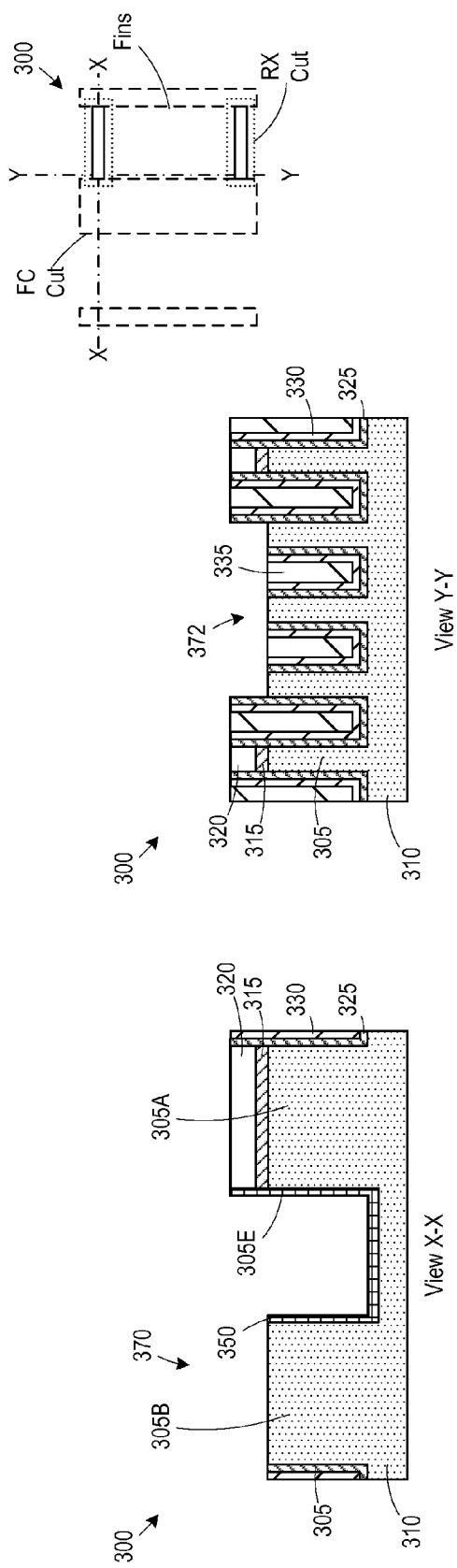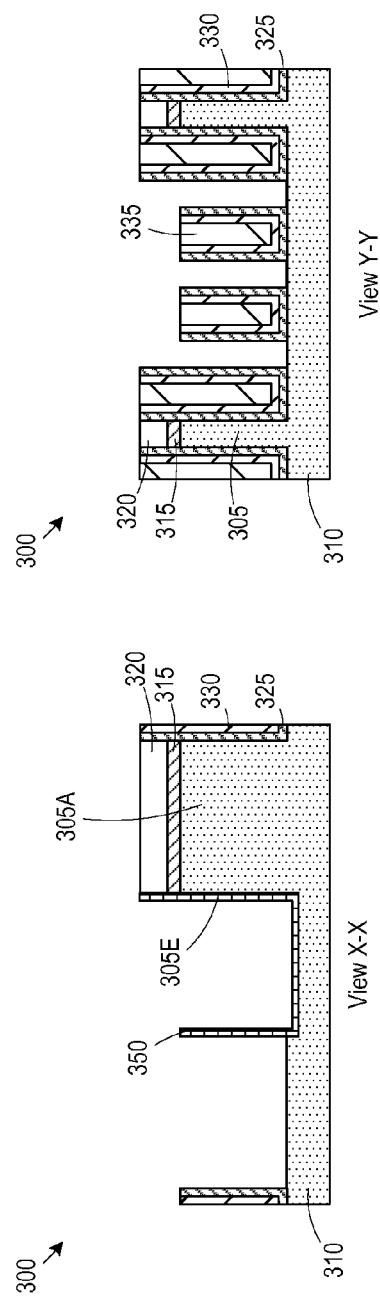
Figure 3I
Figure 3J

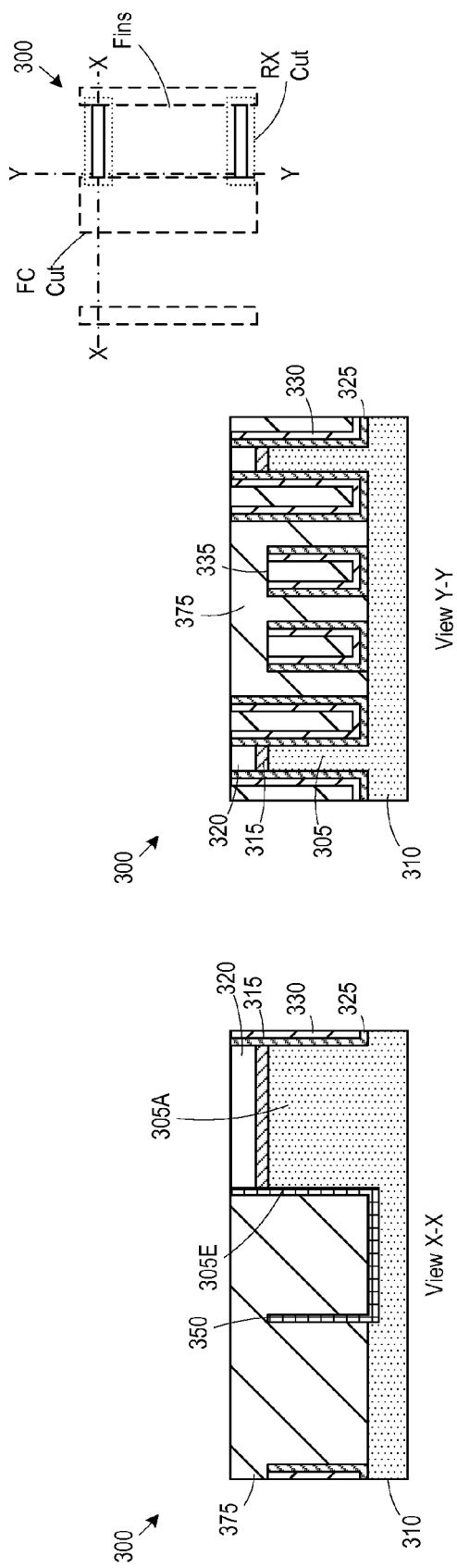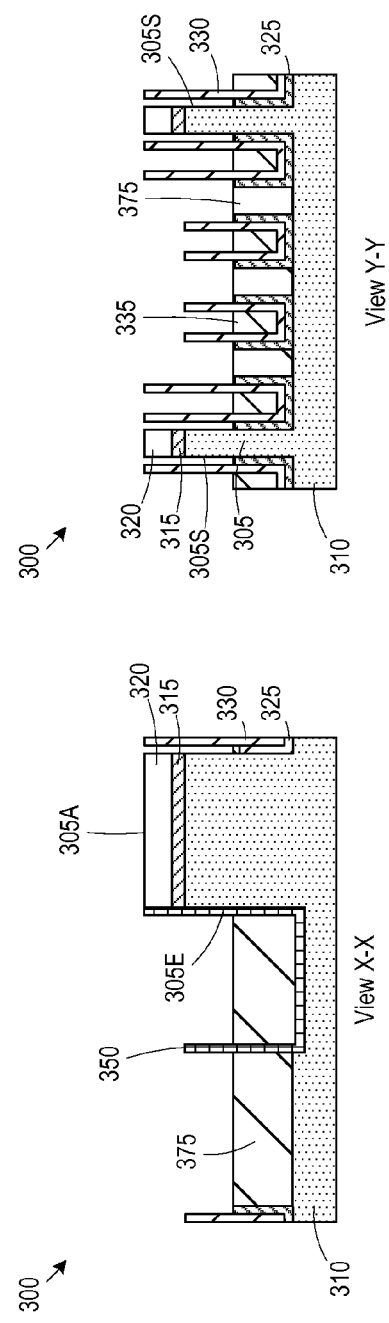
Figure 3K
Figure 3L

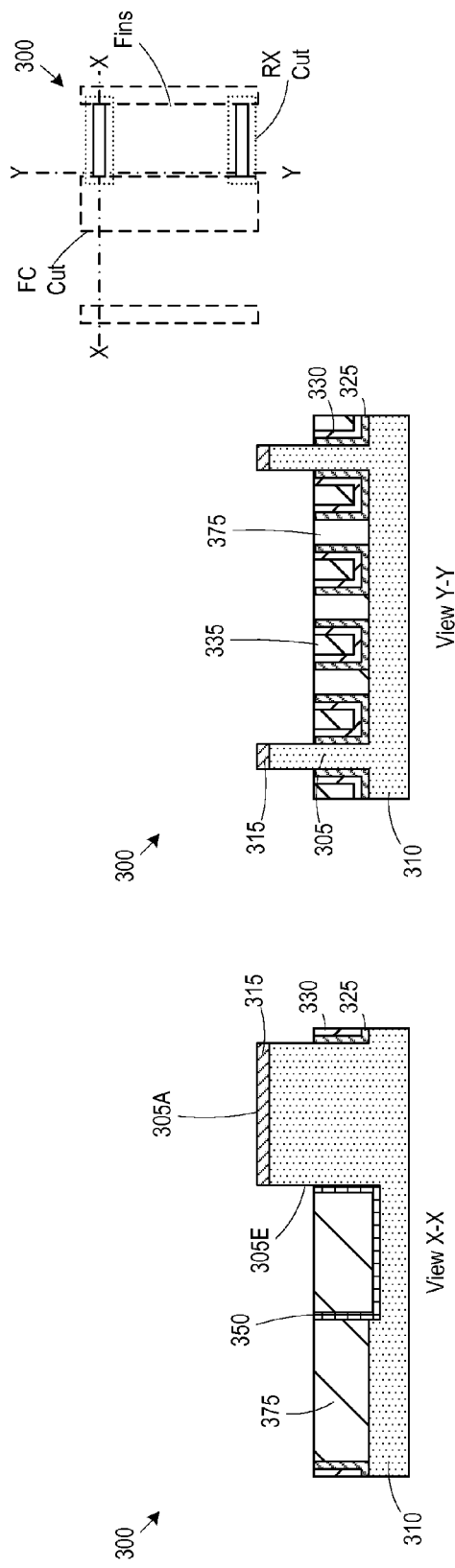
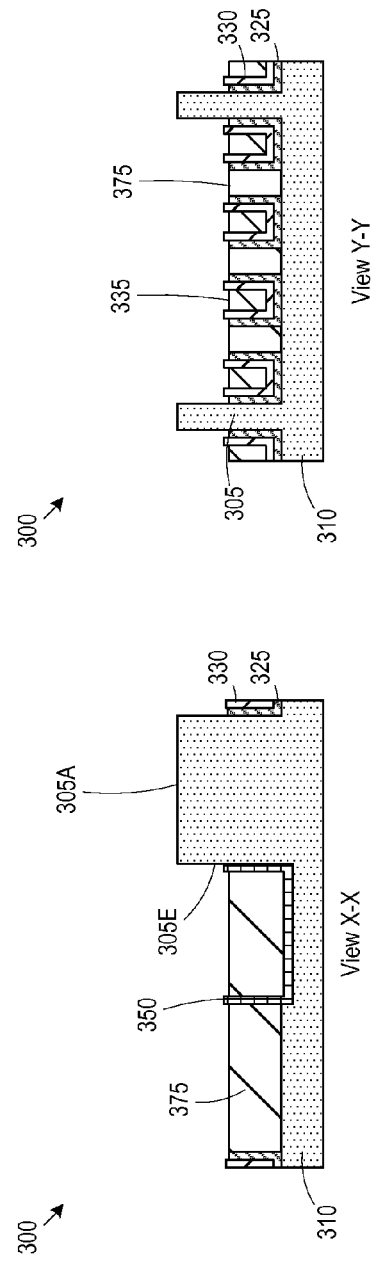
Figure 3M
Figure 3N

METHODS OF PERFORMING FIN CUT ETCH PROCESSES FOR FINFET SEMICONDUCTOR DEVICES AND THE RESULTING DEVICES

BACKGROUND OF THE INVENTION

1. Field of the Invention

The present disclosure generally relates to the fabrication of integrated circuits, and, more particularly, to various methods of performing fin cut etch processes for FinFET semiconductor devices and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art integrated circuit product 100 that is formed above a semiconductor substrate 105. In this example, the product 100 includes five illustrative fins 110, 115, a shared gate structure 120, a sidewall spacer 125, and a gate cap 130. The product 100 implements two different FinFET transistor devices (N-type and P-type) with a shared gate structure. The gate structure 120 is typically comprised of a layer of insulating material (not separately shown), e.g., a layer of high-k insulating material or silicon dioxide, and one or more conductive material layers (e.g., metal and/or polysilicon) that serve as the gate electrode for the transistors on the product 100. The fins 110, 115 have a three-dimensional configuration. The portions of the fins 110, 115 covered by the gate structure 120 define the channel regions of the FinFET transistor devices on the product 100. An isolation structure 135 is formed between the fins 110, 115. The fins 110 are associated with a transistor device of a first type (e.g., N-type), and the fins 115 are associated with a transistor device of a complementary type (e.g., P-type). The gate structure 120 is shared by the N-type and P-type transistors, a common configuration for memory products, such as static random access memory (SRAM) cells.

Typically, fins are formed in a regular array. To define separate transistor devices, the length of the fins may be adjusted and some fins or portions of fins may be removed. For example, a fin cut or "FC cut" process cuts fins in the cross direction by removing fin portions inside the FC cut mask. An active region cut process, or "RX cut" process removes one or more of the fin segments in the parallel direction by removing fin portions located outside the RX cut mask. The FC cut mask exposes portions of the fins and the dielectric material disposed above and between the fin portions. An etch process forms a trench that removes the dielectric material and the fin portions. The FC cut process exposes end surfaces of the fins where the FC cuts are performed. The RX cut mask covers fin portions that are to be retained and exposes other fin portions that are to be removed. The dielectric material above the fin portions to be removed is removed to expose the underlying fin portions. A subsequent etch process removes the exposed fin portions. However, because some of the end surfaces of the fin portions that were previously exposed during the FC cut are still exposed during the fin removal etch, the end surfaces can be eroded or undercut by the RX cut, thereby damaging the associated fins or segments.

After performing the RX cut, the recesses created by removing the fins are typically filled with a liner material. This liner material also covers the exposed end surfaces, so that a low-k dielectric material can be formed and densified in the regions between the fins to create isolation regions without damaging the fins. The isolation regions are etched back to expose portions of the fins, however, due to the high aspect ratio of the recesses and the different material of the liner layer, the liner material is not easily removed. Typically, the liner layer has a higher dielectric constant than the isolation regions. The remaining portions of the liner layer increase the capacitance of the device, thereby reducing performance.

FIGS. 2A-2B are cross-section views of a device 200 showing a first fin segment 205A and a second fin segment 205B defined above a substrate 210. In FIGS. 2A-2B, the cross-section is taken through the long axis of the fin segments 205A, 205B. The fin segments 205A, 205B were formed by performing an FC cut to remove a portion of the longer fin 205, as described above, to define a trench 212. An oxide cap layer 215 and a nitride cap layer 220 (previously used as hard mask layers to pattern the fin 205 in the substrate 210) are present above the fin segment 205A. Liners 225, 230 are formed on ends and the sidewalls of the fin 205 prior to forming the trench 212 that separates the fin 205 into the fin segments 205A, 205B. After formation of the trench 212, the cap layers 215, 220 were selectively removed from the fin segment 205B so that the fin segment 205B can be removed during a subsequent RX cut process. The cap layers 215, 220 remain positioned above the fin segment 205A.

FIG. 2B illustrates the device 200 after the RX cut process was performed. Because the cut end surface 205E of the fin segment 205A is exposed, the isotropic RX cut etch process erodes the end surface 205E, thereby damaging the fin segment 205A.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins for FinFET semiconductor devices, and the resulting semiconductor devices. One method includes, among other things, forming a plurality of fins above a substrate. A first mask layer is formed above a first subset of the plurality of fins. The first mask layer has a first opening defined therein. A first portion of each of the fins in the first subset exposed by the first opening is removed to define, for each of the fins in the first subset, a first fin segment and a second fin segment, each having a cut end surface. A first liner layer is formed on at least the cut end surface of the first fin segment for each of the fins in the first subset. A second mask layer is formed above a second subset of the plurality of fins. The second mask layer has a second opening. An etching process is performed to remove second portions of the second subset of fins exposed by the second opening. The first liner layer protects the cut end surface of at least the first fin segment during the removing.

Another illustrative method disclosed herein includes, among other things, forming a plurality of fins above a substrate. Dielectric material is formed above and between the plurality of fins. A first mask layer is formed above the dielectric material, the first mask layer having a first opening defined therein to expose a first portion of the dielectric material above at least a first subset of the plurality of fins. A first trench is formed in the dielectric material and the fins in the first subset to remove first portions of each of the fins in the first subset exposed by the first opening and define, for each of the fins in the first subset, a first fin segment and a second fin segment, each having a cut end surface. A first liner layer is formed in the first trench and on at least the cut end surface of the first fin segment for each of the fins in the first subset. A second mask layer is formed above the dielectric material, the second mask layer having a second opening defined therein to expose a second portion of the dielectric material above a second subset of the plurality of fins. A second trench is formed in the dielectric material by removing the second portion of the dielectric material to expose a top surface of the fins in the second subset. Second portions of the second subset of fins exposed by the second trench are removed. The first liner layer protects the cut end surfaces of the fins in the first subset during the removing of the second portions.

One illustrative integrated circuit product disclosed herein includes, among other things, a plurality of fins defined in a substrate. A first recess is defined between a first pair of fins in the plurality of fins, the first recess being at least partially filled with a first low-k dielectric material. A second recess defined by a removal of at least a portion of an intermediate fin disposed between a second pair of fins in the plurality of fins is at least partially filled by the first low-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1:
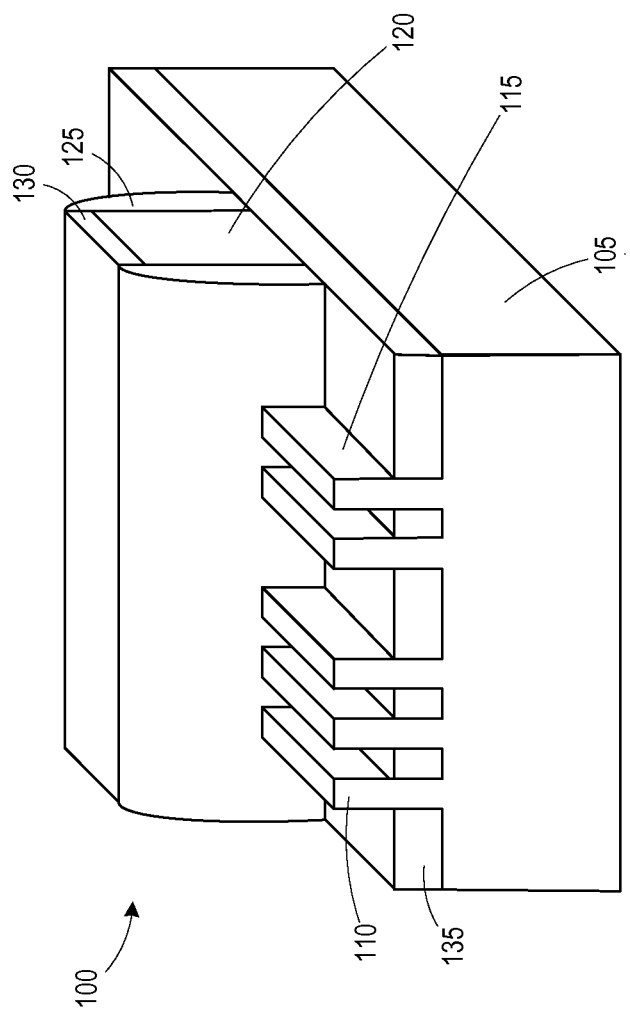
FIG. 1 is a perspective view of one illustrative embodiment of a prior art semiconductor product.
Figure 2A:
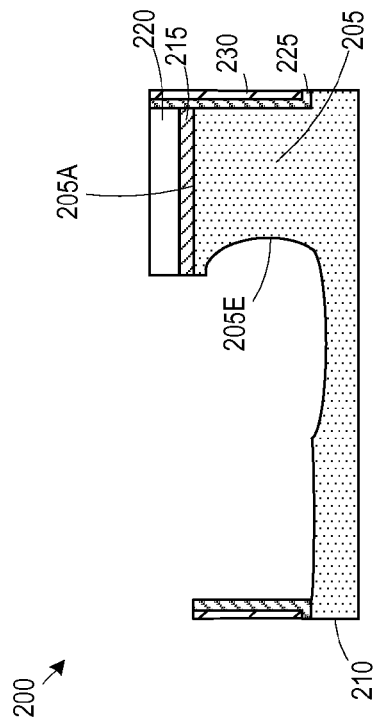
FIGS. 2A-2B depict damage to a fin segment caused by prior art FC cut and RX cut processes.
Figure 2B:
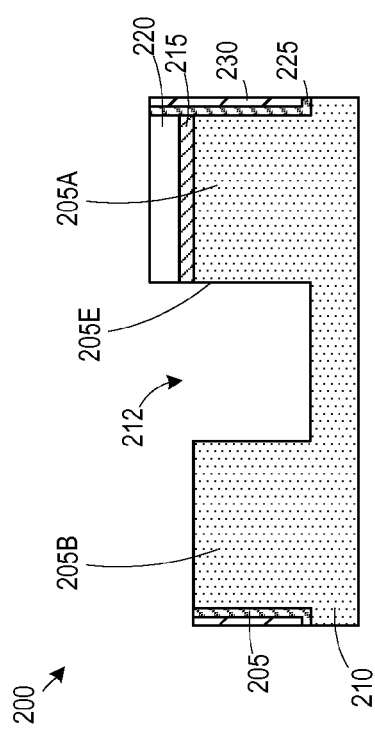

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming fins for FinFET semiconductor devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

Figure 3A:
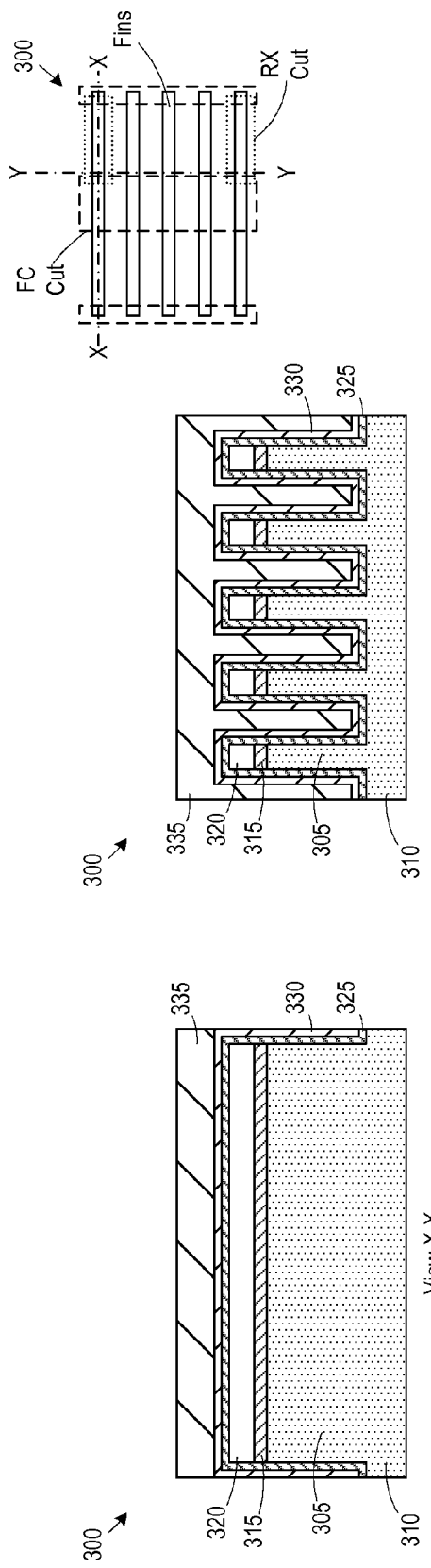
FIGS. 3A-3N depict one illustrative method disclosed for forming fins for a semiconductor product and the resulting semiconductor devices.

FIGS. 3A-3N depict one illustrative method disclosed for forming fins for semiconductor products and the resulting devices. The illustrative product 300 includes a plurality of fins 305 formed in a semiconductor substrate 310. The substrate 310 may have a variety of configurations, such as the depicted bulk silicon configuration. The substrate 310 may also have a silicon-on-insulator (SOI) configuration that includes a bulk silicon layer, a buried insulation layer and an active layer, wherein semiconductor devices are formed in and above the active layer. The substrate 310 may be formed of silicon or silicon germanium or it may be made of materials other than silicon, such as germanium. Thus, the terms "substrate" or "semiconductor substrate" should be understood to cover all semiconducting materials and all forms of such materials. The substrate 310 may have different layers.

FIGS. 3A-3N also include a simplistic plan view of the product 300 (in the upper right corner of each sheet) that depicts the location where various cross-sectional views depicted in the following drawings will be taken. More specifically, the view "X-X" is taken along the long axis of a fin 305 that is to be segmented, and the view "Y-Y" is a cross-sectional view that is taken through the plurality of fins 305 outside the segmentation cut region in a direction that is transverse to the long axis of the fins 305. Not all of the features illustrated in the views "X-X" and "Y-Y" are replicated in the simplistic plan view.

FIG. 3A depicts the product 300 at a point in fabrication wherein several process operations have been performed. First, the plurality of fins 305 were formed using cap layers 315, 320 (e.g., silicon dioxide and silicon nitride, respectively) as a patterned etch mask. In general, the fins 305 define an active region for forming devices, such as FinFET transistors. Next, liner layers 325, 330 (e.g., silicon dioxide and silicon nitride, respectively) were formed above the fins 305. The illustrative product 300 disclosed herein is depicted as being comprised of five illustrative fins 305. However, as will be recognized by those skilled in the art after a complete reading of the present application, the methods and devices disclosed herein may be employed when manufacturing devices having any number of fins. A dielectric layer 335 (e.g., silicon dioxide, a low-k dielectric material, etc.) was then formed between the fins 305 to serve as an isolation structure.

Figure 3B:
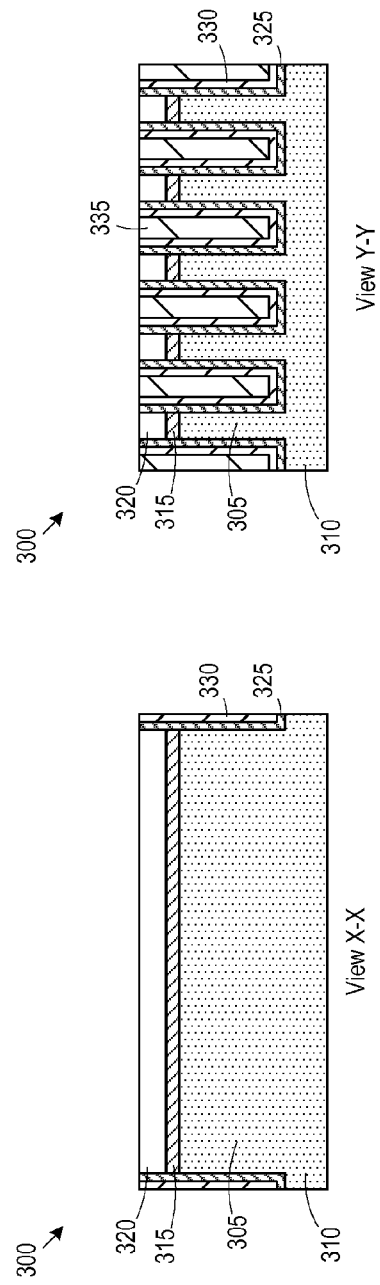

FIG. 3B illustrates the product 300 after a planarization process was performed to remove the portions of the dielectric layer 335 and the liner layers 325, 330 to expose the patterned cap layer 320.

FIG. 3C illustrates the product 300 after a plurality of processes were performed to deposit and pattern a hard mask layer 340 above the dielectric layer 335 to define an FC cut opening 345. In the illustrated embodiment, the hard mask layer 340 was formed using a photolithography stack, including an organic planarization (OPL) layer, an anti-reflective coating (ARC) layer, and a photoresist layer. The ARC layer was formed above the OPL layer, and the photoresist was formed above the ARC layer. The photoresist layer was exposed to radiation using a reticle and developed to generate a pattern. The photoresist pattern was transferred to the ARC and OPL layers, and the photoresist and ARC layers were removed. Thus, the hard mask layer 340 may be the remaining OPL layer.

FIG. 3D illustrates the product 300 after an etch process (e.g., anisotropic reactive ion etch) was performed to implement the FC cut based on the opening 345 to define a trench 347 in the fin 305 (or multiple adjacent fins) and in the surrounding dielectric material (i.e., the cap layers 315, 320, the dielectric layer 335 and liners 325, 330). The trench 347 divides the fin 305 into fin segments 305A, 305B. In the illustrated example, the depth of the trench 347 is greater than the height of the fins 305 to ensure complete removal of the portion of the fin 305 that was cut. Cut end surfaces 305E of the fin segments 305A, 305B are exposed during the FC cut.

Figure 3E:
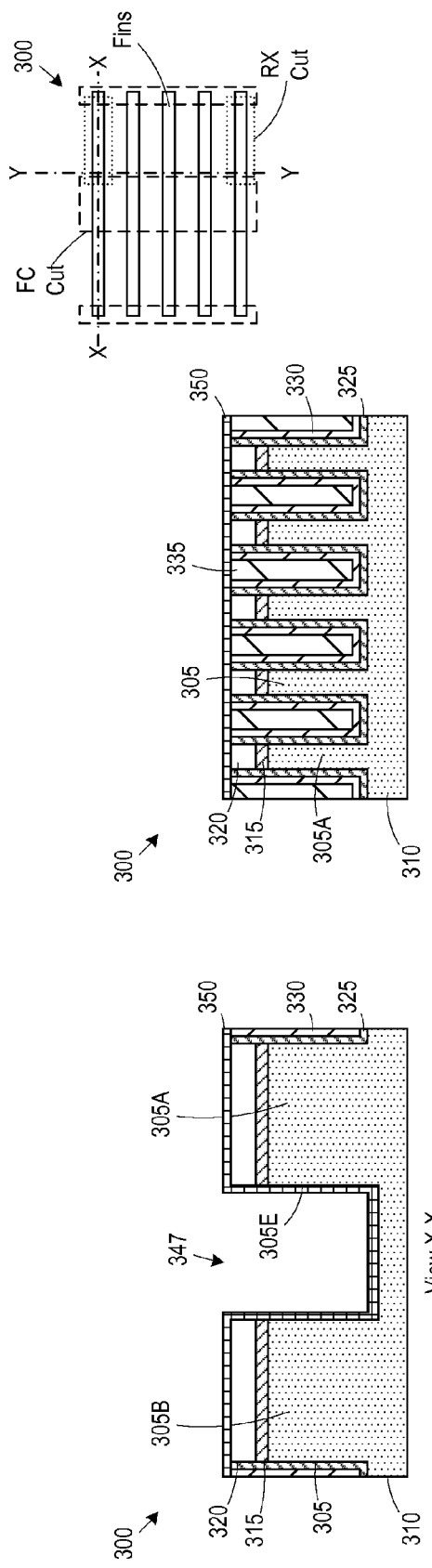

FIG. 3E illustrates the product 300 after an etch process was performed to remove the hard mask layer 340, and after a deposition process was performed to form a liner layer 350 (e.g., silicon nitride having a thickness of about 3-5 nm) in the trench 347 defined in the fin. The liner layer 350 covers the end surfaces 305E.

Figure 3F:
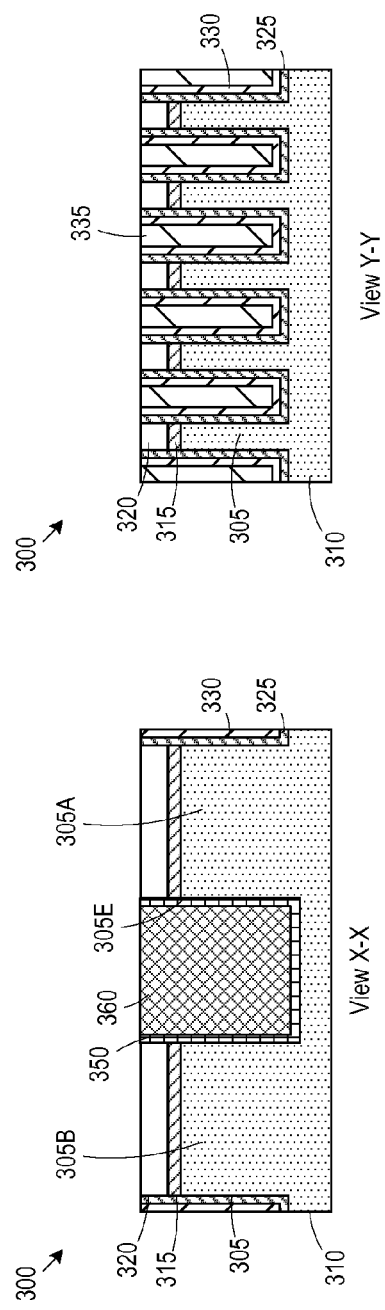

FIG. 3F illustrates the product 300 after a deposition process was performed to form a mask layer 360 (e.g., OPL) to fill the trench 347 and after a planarization process was performed to remove the portions of the mask layer 360 and the liner layer 350 disposed above the fins 305.

FIG. 3G illustrates the product 300 after a plurality of processes were performed to deposit and pattern a hard mask layer 365 (e.g., OPL) above the fins 305 to define an RX cut opening 370 that exposes selected fins 305 to be removed, including in the illustrated example, the fin segment 305B. The RX cut is so named because it removes portions of the active region defined by the fins 305. A photolithography stack may be used to define the hard mask layer 365 and the opening 370, as described above. In the illustrated embodiment, the layers 360, 365 are made of the same material (e.g., OPL) so they merge.

FIG. 3H illustrates the product 300 after an etch process (e.g., anisotropic reactive ion etch) was performed to remove the cap layers 315, 320, the liner layers 325, 330, and the dielectric material 335 exposed by the RX cut opening 370 to define a trench 372 having a bottom surface that exposes the top surface of the fins 305 to be subsequently removed.

FIG. 3I illustrates the product 300 after one or more etch processes were performed to remove the mask layers 360, 365.

FIG. 3J illustrates the product 300 after an isotropic etch process was performed to remove the fins 305 (including the fin segment 305B) that are no longer covered by the cap layers 315, 320. Because the liner layer 350 is present on the end surface 305E of the fin segment 305A, the fin segment 305A is protected from gouging or undercutting during the etch process.

FIG. 3K illustrates the product 300 after a deposition process was performed to deposit a dielectric layer 375 (e.g., silicon dioxide, a low-k dielectric material, etc.) above the fins 305 and after a planarization process was performed to expose the cap layer 320.

FIG. 3L illustrates the product 300 after an etch process was performed to recess the dielectric layer 375 and expose sidewalls 305S of upper portions of the fins 305.

FIG. 3M illustrates the product 300 after an etch process was performed to remove the exposed portions of the cap layer 320 and liner layers 330, 350 (e.g., silicon nitride).

FIG. 3N illustrates the product 300 after an etch process was performed to remove the cap layer 315 to expose the fins 305. This etch process also results in a slight recessing of the dielectric layer 375. Further processing steps may be performed to complete the fabrication of the device, such as forming a gate electrode, doping source and drain regions, forming contacts, etc.

The process flow illustrated above has several advantages. Because the end surface 305E of the fin segments 305A exposed by the FX cut are protected during the RX cut, fin erosion is prevented. Also, the process flow results in a reduced amount of liner material (e.g., silicon nitride) in the recesses created by removing the fins 305, because the recesses are filled with the same dielectric material as the isolation structures between the fins 305, thereby reducing the overall capacitance of the product 300 and leading to increased performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a plurality of fins above a substrate;
   forming a first mask layer above a first subset of said plurality of fins, said first mask layer having a first opening defined therein;
   removing a first portion of each of the fins in said first subset exposed by said first opening to define, for each of the fins in said first subset, a first fin segment and a second fin segment, each having a cut end surface;
   forming a first liner layer on at least said cut end surface of said first fin segment for each of the fins in said first subset;
   forming a second mask layer above a second subset of said plurality of fins, said second mask layer having a second opening; and
   performing an etching process to remove second portions of said second subset of fins exposed by said second opening, wherein said first liner layer protects said cut end surface of at least said first fin segment during the removing.

2. The method of claim of claim 1, wherein said second subset includes said second fin segment.

3. The method of claim 1, wherein said first liner layer protects said cut end surface of said first fin segment during said etching process performed to remove said second portions.

4. The method of claim 1, further comprising forming dielectric material above and between said plurality of fins prior to forming said first mask layer, wherein said first opening exposes a first portion of said dielectric material above said first subset of fins, and removing said first portions of each of the fins in said first subset comprises forming a first trench in said dielectric material and the fins in said first subset to remove said first portions of each of the fins in said first subset.

5. The method of claim 4, wherein said first trench has a depth greater than a height of said plurality of fins above said substrate.

6. The method of claim 4, wherein said second opening exposes a second portion of said dielectric material above said second subset of fins, and the method further comprises:

forming a second trench in said dielectric material by removing said second portion of said dielectric material to expose a top surface of the fins in said second subset; and
removing the second portions of said second subset of fins exposed by said second trench.

7. The method of claim 6, wherein said first trench has a depth greater than a height of said plurality of fins above said substrate.

8. The method of claim 6, wherein forming said dielectric material comprises:
   forming a cap layer on said top surface of said fins:
   forming a second liner layer above said plurality of fins and said cap layer;
   forming a first dielectric layer over said first liner and between said plurality of fins; and
   removing portions of said second liner layer and said first dielectric layer disposed above said cap layer.

9. The method of claim 8, wherein said second liner layer comprises an oxide layer and a nitride layer.

10. The method of claim 8, further comprising forming a second dielectric layer in recesses created by removing said second portions of the fins in said second subset.

11. The method of claim 10, wherein said first and second dielectric layers comprise the same material.

12. The method of claim 10, wherein said first and second dielectric layers each comprise low-k dielectric material.

13. A method, comprising:
    forming a plurality of fins above a substrate;
    forming dielectric material above and between said plurality of fins;
    forming a first mask layer above said dielectric material, said first mask layer having a first opening defined therein to expose a first portion of said dielectric material above at least a first subset of said plurality of fins;
    forming a first trench in said dielectric material and the fins in said first subset to remove a first portion of each of the fins in said first subset exposed by said first opening and define, for each of the fins in said first subset, a first fin segment and a second fin segment, each having a cut end surface;
    forming a first liner layer in said first trench and on at least said cut end surface of said first fin segment for each of the fins in said first subset;
    forming a second mask layer above said dielectric material, said second mask layer having a second opening defined therein to expose a second portion of said dielectric material above a second subset of said plurality of fins;
    forming a second trench in said dielectric material by removing said second portion of said dielectric material to expose a top surface of the fins in said second subset; and
    removing second portions of said second subset of fins exposed by said second trench, wherein said first liner layer protects said cut end surfaces of the fins in said first subset during the removing of said second portions.

14. The method of claim 13, wherein said second subset includes said second fin segment or at least one of the fins in said first subset.

15. The method of claim 13, wherein forming said dielectric material comprises:
    forming a cap layer on said top surface of said fins:
    forming a second liner layer above said plurality of fins and said cap layer;

forming a first dielectric layer over said first liner and between said plurality of fins; and removing portions of said second liner layer and said first dielectric layer disposed above said cap layer.

16. The method of claim 15, wherein said second liner layer comprises an oxide layer and a nitride layer.

17. The method of claim 15, further comprising forming a second dielectric layer in recesses created by removing said second portions of the fins in said second subset.

18. The method of claim 17, wherein said first and second dielectric layers comprise the same material.

19. The method of claim 17, wherein said first and second dielectric layers each comprise low-k dielectric material.

20. The method of claim 13, wherein said first trench has a depth greater than a height of said plurality of fins above said substrate.

* * * * *